United States Patent
Cheng et al.

(10) Patent No.: US 8,035,980 B2
(45) Date of Patent: Oct. 11, 2011

(54) CIRCUIT STRUCTURE AND CIRCUIT SUBSTANCE FOR MODIFYING CHARACTERISTIC IMPEDANCE USING DIFFERENT REFERENCE PLANES

(76) Inventors: Yu-Chiang Cheng, Taipei (TW); Kuo-Ming Chuang, Taipei (TW)

( * ) Notice: Subject to any disclaimer, the term of this patent is extended or adjusted under 35 U.S.C. 154(b) by 315 days.

(21) Appl. No.: 12/472,205

(22) Filed: May 26, 2009

(65) Prior Publication Data

US 2009/0231065 A1    Sep. 17, 2009

Related U.S. Application Data

(63) Continuation-in-part of application No. 11/149,795, filed on Jun. 9, 2005, now abandoned.

(30) Foreign Application Priority Data

Sep. 15, 2004   (TW) ................................ 93127823 A

(51) Int. Cl.
*H05K 7/00* (2006.01)
(52) U.S. Cl. ........ 361/780; 361/794; 361/800; 361/816; 361/818; 174/250
(58) Field of Classification Search .................. 174/250, 174/255; 361/780, 777, 794, 800, 816, 818, 361/748–751, 790, 762, 728, 729
See application file for complete search history.

(56) References Cited

U.S. PATENT DOCUMENTS 6,614,325 B1 * 9/2003 Kocin .............................. 333/12

FOREIGN PATENT DOCUMENTS

JP    02000353895 A   * 12/2000

* cited by examiner

*Primary Examiner* — Hoa C Nguyen
(74) *Attorney, Agent, or Firm* — Apex Juris, pllc; Tracy M. Helms

(57) ABSTRACT

A circuit structure for modifying characteristic impedance by using different reference planes is provided. The structure comprises an analog signal line, a digital signal line, a corresponding reference plane for analog signals and a corresponding reference plane for digital signals. Wherein, the line width of the analog signal line is the same as that of the digital signal line. In addition, the distance between the analog signal line and the corresponding analog signal reference plane is longer than the distance between the digital signal line and the corresponding digital signal reference plane. Accordingly, the characteristic impedance mismatch during signal transmission can be solved and the quality of signal transmission can be improved.

20 Claims, 2 Drawing Sheets

CIRCUIT STRUCTURE AND CIRCUIT SUBSTANCE FOR MODIFYING CHARACTERISTIC IMPEDANCE USING DIFFERENT REFERENCE PLANES

CROSS-REFERENCE TO RELATED APPLICATION

This application is a continuation in part of Ser. No. 11/149,795, filed on Jun. 9, 2005 which claims the priority benefit of Taiwan application serial no. 93127823, filed on Sep. 15, 2004. All disclosure of U.S. Ser. No. 11/149,795 and the Taiwan application no. 93127823 is incorporated herein by reference.

BACKGROUND OF THE INVENTION

1. Field of the Invention

The present invention relates to a circuit substrate, and more particularly, to a circuit structure and a circuit substrate for modifying characteristic impedance by using different reference planes.

2. Description of the Related Art

Motherboards are an essential part of computers, controlling signal and data transmission, such as digital signals or analog signals, between devices. Generally speaking, signals transmitted in or between computers are presented by separate-type digital signals, such as signals with a high-voltage or low-voltage level, rather than the continuously varying signals as analog signals. Therefore, when analog signals are inputted from peripheral devices to a processor, an analog-digital transformation process is performed to transfer the analog signals into digital signals to complete signal transmission.

Additionally, in circuit layouts, characteristic impedance for analog signals should be higher than that for digital signals. However, when analog signals and digital signals coexist in the same motherboard, analog signals and digital signals of the same plane share the same reference plane, such as a power plane or a ground plane as a voltage reference for transmitting the analog and digital signals. This method, however, has the following problems. The high characteristic impedance for the digital signals would result in impedance mismatch. In consequence, electrical-magnetic interference (EMI) becomes more serious.

The conventional method for resolving the impedance mismatch is by increasing the line width of the digital signal line or reducing the line width of the analog signal line to modulate the impedance mismatch. However, since the digital signal line and the analog signal line are on the same plane, if the line width of the digital signal line is increased, the original line spaces of the layout would change, and the density of the layout would decline. Additionally, for the line width of the analog line to be reduced, more sophisticated equipment is required for the process, and the manufacturing costs of motherboards will be higher.

SUMMARY OF THE INVENTION

Accordingly, the present invention is directed to a circuit structure for modifying characteristic impedance by using different reference planes. The circuit structure is used to modify desired characteristic impedance of digital and analog signals to achieve characteristic impedance match.

In order to achieve the object as described, the present invention provides a circuit structure for modifying characteristic impedance by using different reference planes, the circuit structure comprising: an analog signal line transmitting analog signals; a digital signal line on the same plane as the analog signal line, transmitting digital signals and having the same line width as the analog signal line; an analog signal reference plane operative as a corresponding voltage reference of the analog signal line to transmit the analog signals; a digital signal reference plane operative as a corresponding voltage reference of the digital signal line to transmit the digital signals; a first dielectric layer between the analog signal line or a digital signal line and the analog signal reference plane; and a second dielectric layer between the analog signal line or the digital signal line and the digital signal reference plane, the second dielectric layer is thinner than the first dielectric layer to modify a characteristic impedance of the analog signals to be higher than a characteristic impedance of the digital signals.

The circuit structure for modifying characteristic impedance by using different reference planes may be such that the analog signal reference plane is a power plane or a ground plane.

The circuit structure for modifying characteristic impedance by using different reference planes may be such that the digital signal reference plane is a power plane or a ground plane.

The circuit structure for modifying characteristic impedance by using different reference planes may be such that the analog signal line is in the first dielectric layer and the digital signal line is in the second dielectric layer.

The circuit structure for modifying characteristic impedance by using different reference planes may be such that the digital signal line is in the first dielectric layer and the analog signal line is in the second dielectric layer.

The circuit substrate for modifying characteristic impedance by using different reference planes can be such that the circuit substrate comprises an analog signal line transmitting analog signals; a digital signal line on a different plane and adjacent to the analog signal line, transmitting digital signals and having the same line width as the analog signal line; an analog signal reference plane, operative as a corresponding voltage reference of the analog signal line to transmit the analog signals; a digital signal reference plane operative as a corresponding voltage reference of the digital signal line to transmit the digital signals; a first dielectric layer between the analog signal line and the analog signal reference plane; and a second dielectric layer between the digital signal line and the digital signal reference plane, the second dielectric layer is thinner than first dielectric layer to modify a characteristic impedance of the analog signals to be higher than a characteristic impedance of the digital signals.

Here, the circuit substrate for modifying characteristic impedance by using different reference planes may further comprises a third dielectric layer between the first dielectric layer and the second dielectric layer.

The circuit substrate for modifying characteristic impedance by using different reference planes may be such that the analog signal reference plane is a power plane or a ground plane. Claim 7.

The circuit substrate for modifying characteristic impedance by using different reference planes may be such that the digital signal reference plane is a power plane or a ground plane.

A circuit substrate for modifying characteristic impedance by using different reference planes may be such that the circuit substrate comprises an analog signal line transmitting analog signals; an analog signal reference plane adjacent to the analog signal line operative as a corresponding voltage reference of the analog signal line to transmit the analog signals; a first dielectric layer between the analog signal line and the analog signal reference plane; a digital signal line transmitting digital signals and having the same line width as the analog signal line; a digital signal reference plane adjacent to the digital signal line operative as a corresponding voltage reference of the digital signal line to transmit the digital signals; and a second dielectric layer between the digital signal reference plane and the digital signal line, the second dielectric layer is thinner than the first dielectric layer to modify a characteristic impedance of the analog signals to be higher than a characteristic impedance of the digital signals.

Here, the circuit substrate for modifying characteristic impedance by using different reference planes may comprise a third dielectric layer between the analog signal reference plane and the digital signal reference plane.

The circuit substrate for modifying characteristic impedance by using different reference planes may be such that the analog signal reference plane is a power plane or a ground plane.

The circuit substrate for modifying characteristic impedance by using different reference planes may be such that the digital signal reference plane is a power plane or a ground plane.

A circuit substrate for modifying characteristic impedance by using different reference planes may be such that the circuit substrate comprises an analog signal line transmitting analog signals; plural analog signal reference planes having the analog signal line therebetween and operative as a corresponding voltage reference of the analog signal line to transmit the analog signals; a first dielectric layer between the analog signal reference planes; a digital signal line transmitting digital signals and having the same line width as the analog signal line; plural digital signal reference planes having the digital signal line therebetween and operative as a corresponding voltage reference of the digital signal line to transmit the digital signals; and a second dielectric layer between the digital signal reference planes, the second dielectric layer is thinner than the first dielectric layer to modify a characteristic impedance of the analog signals to be higher than a characteristic impedance of the digital signals.

The circuit substrate for modifying characteristic impedance by using different reference planes may be such that at least one analog signal reference plane is on the same plane with at least one digital signal reference plane.

The circuit substrate for modifying characteristic impedance by using different reference planes may further comprise a third dielectric layer between the analog signal The circuit substrate for modifying characteristic impedance by using different reference planes may further comprise a third dielectric layer between the digital signal reference planes.

The circuit substrate for modifying characteristic impedance by using different reference planes may further comprise a forth dielectric layer between the digital signal reference planes.

The circuit substrate for modifying characteristic impedance by using different reference planes may be such that the analog signal reference plane is a power plane or a ground plane.

The circuit substrate for modifying characteristic impedance by using different reference planes may be such that the digital signal reference plane is a power plane or a ground plane.

The digital signal line and the analog signal line of the present invention use different reference planes as voltage references while digital signals and analog signals are transmitted. Accordingly, the impedance mismatch resulting from the same reference plane used by the digital and the analog signals of the same plane can be solved, and quality of signal transmission can be improved.

The above and other features of the present invention will be better understood from the following detailed description of the embodiments of the invention that is provided in conjunction with the accompanying drawings.

BRIEF DESCRIPTION OF THE DRAWINGS

The above and other objects of the present invention will become readily apparent by reference to the following detailed description when considered in conjunction with the accompanying drawings wherein.

DESCRIPTION OF SOME EMBODIMENTS

Embodiments of the present invention will be explained with reference to the accompanied drawings.

Figure 1A:
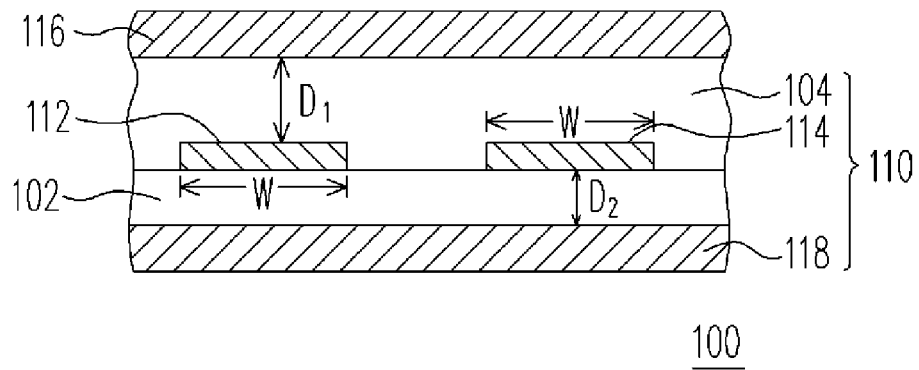
FIG. 1(A) is a schematic cross-sectional view showing a circuit structure for modifying characteristic impedance by using different reference planes according to an embodiment of the present invention.

FIG. 1(A) is a schematic cross-sectional view showing a circuit structure for modifying characteristic impedance by using different reference planes according to an embodiment of the present invention. In this embodiment, the circuit structure 110 comprises an analog signal line 112, a digital signal line 114, an analog signal reference plane 116, and a digital signal reference plane 118. In this structure, the analog signal line 112 transceives, for example, continuously varying signals inputted from peripheral devices (not shown), or those generated from the digital/analog transformation process. Additionally, the digital signal line 114 transceives, for example, separated-type signals outputted from a processor (not shown), or those generated from the analog/digital transformation process.

The circuit substrate 100 of FIG. 1(A) discloses multiple dielectric layers, where the dielectric layers 102 and 104 of the circuit substrate 100 are stacked in the circuit structure 110 such that the signal lines 112 and 114 are separated from the reference planes 116 and 118 by predetermined distances, respectively.

Note that the characteristic impedance for the analog signal should be higher than that for the digital signal in circuit layout. In this embodiment, different reference planes are used to modify the characteristic impedance for the analog and digital signals. The analog signal line 112, for example, is on the same plane with the digital signal line 114, and both analog and digital signal lines 112 and 114 have the same line width, thereby automatically reducing the equipment manufacturing cost. The analog signal reference plane 116 and the digital signal reference plane 118, for example, are at two opposing sides parallel to the analog signal line 112 and the digital signal line 114. The analog signal line 112 is separated from the analog signal reference plane 116 by a first distance D1, and the digital signal line 114 is separated from the digital signal reference plane 118 by a second distance D2. Here in this embodiment, the second dielectric layer between the analog signal line or the digital signal line and the digital signal reference plane is designed such that the second dielectric layer is thinner than the first dielectric layer to modify the characteristic impedance of the analog signals to be higher than the characteristic impedance of the digital signals.

The equivalent formula of the characteristic impedance Z is given by:

$$Z = \left(\frac{60}{\sqrt{E}}\right) \ln\left[\frac{4D}{0.67\pi W(0.8 + T/W)}\right]$$

When the line width W and the cross-sectional area are constant, if the distance D between a signal line and a reference plane is longer, the characteristic impedance Z of the signal line accordingly increases. According to the relation described above, in this embodiment, the distance between the analog signal line 112 and the analog signal reference plane 116, i.e. the first distance D1, is increased, or the distance between the digital signal line 114 and the digital signal reference plane 118, i.e. the second distance D2, is reduced, such that the first distance D1 is longer than the second distance D2 to modify the characteristic impedance for the analog signals and digital signals. The quality of the signal transmission can thus be improved.

The characteristic impedance Z obtained according to the method described above enables the characteristic impedance for the analog signal to be higher than the characteristic impedance for the digital signal. Accordingly, the high characteristic impedance resulting from the same reference plane used by the digital signals and analog signals of the same plane can be avoided. Without changing the line width, the present invention is able to lower costs, provide simple circuit layouts, and reduce electrical-magnetic interference (EMI).

In addition, the analog signal reference plane 216 or/and digital signal reference plane 218 can be a power plane or a ground plane.

Figure 1B:
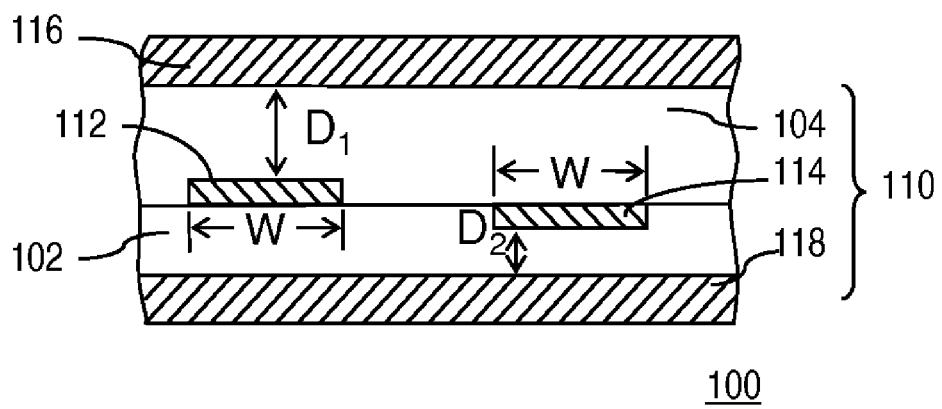
FIG. 1(B) is a schematic cross-sectional view showing a circuit structure for modifying characteristic impedance by using different reference planes according to a second embodiment of the present invention.

FIG. 1(B) is a schematic cross-sectional view showing a circuit structure for modifying characteristic impedance by using different reference planes according to an embodiment of the present invention. Here, this structure is the same as FIG. 1(A) and both analog signal line 112 and the digital signal line 114 are on the same plane but the analog signal line 112 is positioned in the first dielectric layer and the digital signal line is in the second dielectric layer while both analog and digital signal lines 112 and 114 in FIG. 1(A) are positioned in the first dielectric layer 102. The rest of the structures and characteristics of FIG. 1(B) is the same as FIG. 1(A) and the explanation of which is omitted.

Figure 1C:
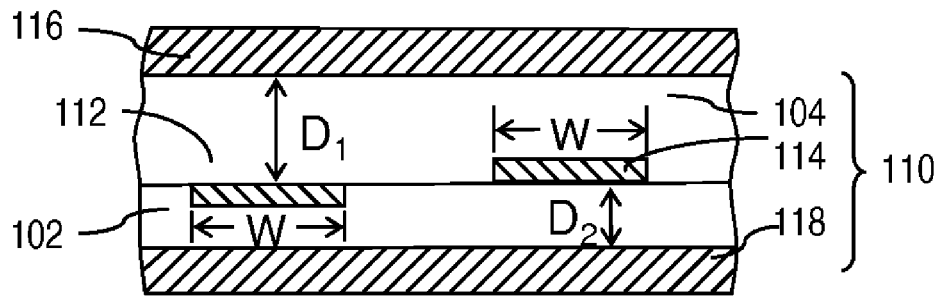
FIG. 1(C) is a schematic cross-sectional view showing a circuit structure for modifying characteristic impedance by using different reference planes according to a third embodiment of the present invention.

FIG. 1(C) is a schematic cross-sectional view showing a circuit structure for modifying characteristic impedance by using different reference planes according to an embodiment of the present invention. Here, this structure is the same as FIGS. 1(A) and 1(B) both analog signal line 112 and the digital signal line 114 are on the same plane but the analog signal line 112 is positioned in the second dielectric layer and the digital signal line is in the first dielectric layer. The rest of the structures and characteristics of FIG. 1(C) is the same as FIGS. 1(A) and 1(B) and the explanation of which is omitted.

Figure 2:
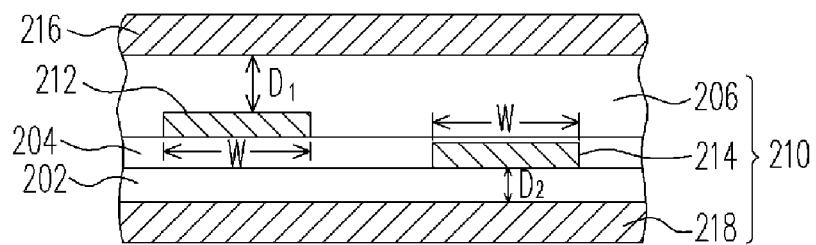
FIG. 2 is a schematic cross-sectional view showing a circuit structure for modifying characteristic impedance by using different reference planes according to a fourth embodiment of the present invention.

FIG. 2 is a schematic cross-sectional view showing a circuit structure for modifying characteristic impedance by using different reference planes according to another embodiment of the present invention. The following is a description of a circuit substrate 200 with multiple dielectric layers. The dielectric layers 202, 204 and 206 of the circuit substrate 200 are stacked in the circuit structure 210 such that the signal lines 212 and 214 are separated, or the signal lines 212 and 214 are separated from the reference planes 216 and 218, by proper distances. In this embodiment, the circuit structure 210 comprises an analog signal line 212, a digital signal line 214, an analog signal reference plane 216 and a digital signal reference plane 218. Compared with the previous embodiments, the analog signal line 212 and the digital signal line 214 in this embodiment are not on the same plane. The analog signal line 212 and the digital signal line 214 are separated, for example, by a dielectric layer 204 with a proper distance.

According to the formula described above, when the line width W and the cross-sectional area are constant, if the distance between the analog signal line 212 and the analog reference plane 216 is longer, the characteristic impedance Z of the analog signal line 212 accordingly increases. According to the relation described above, in this embodiment, the distance between the analog signal line 212 and the analog signal reference plane 216, i.e. the first distance D1, is increased, or the distance between the digital signal line 214 and the digital signal reference plane 218, i.e. the second distance D2, is reduced such that the first distance D1 is longer than the second distance D2 to modify the characteristic impedance for the analog signal and digital signal and improve the quality of the signal transmission. Without changing the line width of the analog line 212 and the digital line 214, the present invention is able to reduce electrical-magnetic interference. Here, also, the analog signal reference plane 216 or/and digital signal reference plane 218 can be a power plane or a ground plane.

Figure 3:
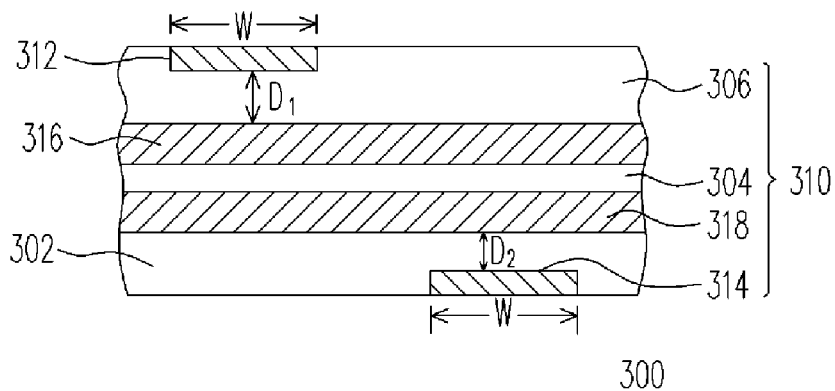
FIG. 3 is a schematic cross-sectional view showing a circuit structure for modifying characteristic impedance by using different reference planes according to a fifth embodiment of the present invention.

FIG. 3 is a schematic cross-sectional view showing a circuit structure for modifying characteristic impedance by using different reference planes according to yet another embodiment of the present invention. The following is a description of a circuit substrate 300 with multiple dielectric layers. The dielectric layers 302, 304 and 306 of the circuit substrate 300 are stacked in the circuit structure 310 such that the signal lines 312 and 314 are separated from the reference planes 316 and 318, or the reference plane 316 is separated from reference plane 318, by proper distances. In this embodiment, the circuit structure 310 comprises an analog signal line 312, a digital signal line 314, an analog signal reference plane 316 and a digital signal reference plane 318. Compared with the previous embodiments, the analog signal line 312 is above the analog signal reference plane 316 and the digital signal line 314 is under the digital signal reference plane 318. The analog signal reference plane 316 and the digital signal reference plane 318 are separated, for example, by a dielectric layer 304 with a proper distance.

According to the same formula described above, when the line width W and the cross-sectional area are constant, if the distance between the analog signal line 312 and the analog reference plane 316 is longer, the characteristic impedance Z of the analog signal line 312 accordingly increases. According to the relation described above, in this embodiment, the distance between the analog signal line 312 and the analog signal reference plane 316, i.e. the first distance D1, is increased, or the distance between the digital signal line 314 and the digital signal reference plane 318, i.e. the second distance D2, is reduced such that the first distance D1 is longer than the second distance D2 to modify the characteristic impedance for the analog signal and digital signal and improve the quality of the signal transmission. Without having to change the line widths of the analog signal line 312 and the digital signal line 314, the present invention is able to reduce electrical-magnetic interference. Again, the analog signal reference plane 216 or/and digital signal reference plane 218 can be a power plane or a ground plane.

Figure 4:
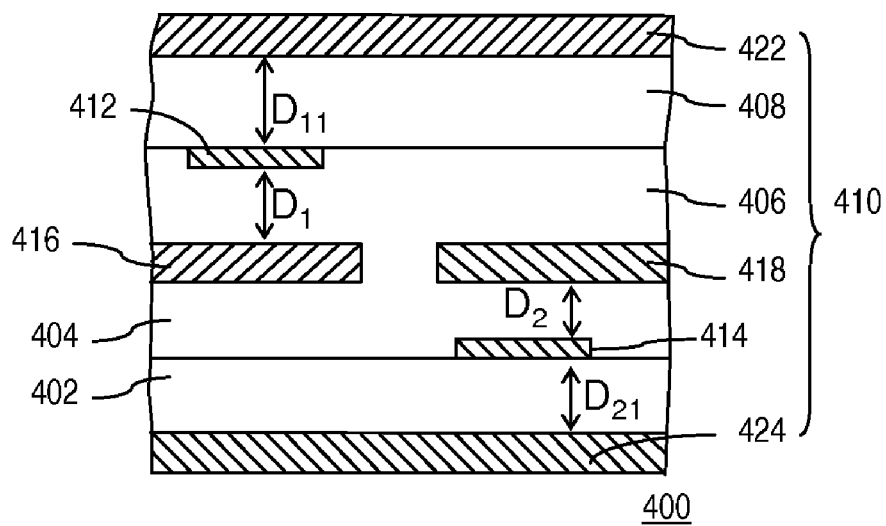
FIG. 4 is a schematic cross-sectional view showing a circuit structure for modifying characteristic impedance by using different reference planes according to a sixth embodiment of the present invention.

FIG. 4 is a schematic cross-sectional view showing a circuit structure for modifying characteristic impedance by using different reference planes according to a different embodiment of the present invention. Compared to the previous embodiments, this embodiment includes a second analog signal reference plane 416 and a second digital signal reference plane 418. As noted above, the closest reference plane is deemed the corresponding one (since D11>D1, 416 is 412's reference plane; since D21>D2, 418 is 414's reference plane). Also, dielectric layers 402, 404, 406 and 408 are included in circuit substrate 400.

According to these embodiments, the digital signal line and the analog signal line of the present invention use different reference planes as voltage references for the transmission of digital signals and analog signals. Accordingly, the characteristic impedance mismatch resulting from the same reference plane used by the digital signal and the analog signal of the same plane can be solved. Without having to change the line width, the present invention is able to lower costs, provide simple circuit layouts and reduce electrical-magnetic interference.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A circuit structure for modifying characteristic impedance by using different reference planes, said circuit structure comprising:
   an analog signal line transmitting analog signals;
   a digital signal line on the same plane as the analog signal line, transmitting digital signals and having the same line width as the analog signal line;
   an analog signal reference plane operative as a corresponding voltage reference of the analog signal line to transmit the analog signals;
   a digital signal reference plane operative as a corresponding voltage reference of the digital signal line to transmit the digital signals;
   a first dielectric layer between the analog signal line or a digital signal line and the analog signal reference plane; and
   a second dielectric layer between the analog signal line or the digital signal line and the digital signal reference plane, said second dielectric layer is thinner than the first dielectric layer to modify a characteristic impedance of the analog signals to be higher than a characteristic impedance of the digital signals.

2. The circuit structure for modifying characteristic impedance by using different reference planes of claim 1, wherein the analog signal reference plane is a power plane or a ground plane.

3. The circuit structure for modifying characteristic impedance by using different reference planes of claim 1, wherein the digital signal reference plane is a power plane or a ground plane.

4. The circuit structure for modifying characteristic impedance by using different reference planes of claim 1, wherein the analog signal line is in the first dielectric layer and the digital signal line is in the second dielectric layer.

5. The circuit structure for modifying characteristic impedance by using different reference planes of claim 1, wherein the digital signal line is in the first dielectric layer and the analog signal line is in the second dielectric layer.

6. A circuit substrate for modifying characteristic impedance by using different reference planes, the circuit substrate comprising:
   an analog signal line transmitting analog signals;
   a digital signal line on a different plane and adjacent to the analog signal line, transmitting digital signals and having the same line width as the analog signal line;
   an analog signal reference plane, operative as a corresponding voltage reference of the analog signal line to transmit the analog signals;
   a digital signal reference plane operative as a corresponding voltage reference of the digital signal line to transmit the digital signals;
   a first dielectric layer between the analog signal line and the analog signal reference plane; and
   a second dielectric layer between the digital signal line and the digital signal reference plane, said second dielectric layer is thinner than first dielectric layer to modify a characteristic impedance of the analog signals to be higher than a characteristic impedance of the digital signals.

7. The circuit substrate for modifying characteristic impedance by using different reference planes of claim 6, further comprising a third dielectric layer between said first dielectric layer and said second dielectric layer.

8. The circuit substrate for modifying characteristic impedance by using different reference planes of claim 6, wherein the analog signal reference plane is a power plane or a ground plane.

9. The circuit substrate for modifying characteristic impedance by using different reference planes of claim 6, wherein the digital signal reference plane is a power plane or a ground plane.

10. A circuit substrate for modifying characteristic impedance by using different reference planes, the circuit substrate comprising:
   an analog signal line transmitting analog signals;
   an analog signal reference plane adjacent to the analog signal line operative as a corresponding voltage reference of the analog signal line to transmit the analog signals;
   a first dielectric layer between the analog signal line and the analog signal reference plane;
   a digital signal line transmitting digital signals and having the same line width as the analog signal line;
   a digital signal reference plane adjacent to the digital signal line operative as a corresponding voltage reference of the digital signal line to transmit the digital signals; and
   a second dielectric layer between the digital signal reference plane and the digital signal line, said second dielectric layer is thinner than the first dielectric layer to modify a characteristic impedance of the analog signals to be higher than a characteristic impedance of the digital signals.

11. The circuit substrate for modifying characteristic impedance by using different reference planes of claim 10, further comprising a third dielectric layer between the analog signal reference plane and the digital signal reference plane.

12. The circuit substrate for modifying characteristic impedance by using different reference planes of claim 10, wherein the analog signal reference plane is a power plane or a ground plane.

13. The circuit substrate for modifying characteristic impedance by using different reference planes of claim 10, wherein the digital signal reference plane is a power plane or a ground plane.

14. A circuit substrate for modifying characteristic impedance by using different reference planes, the circuit substrate comprising:

an analog signal line transmitting analog signals;

plural analog signal reference planes having said analog signal line therebetween and operative as a corresponding voltage reference of the analog signal line to transmit the analog signals;

a first dielectric layer between said analog signal reference planes;

a digital signal line transmitting digital signals and having the same line width as the analog signal line;

plural digital signal reference planes having said digital signal line therebetween and operative as a corresponding voltage reference of the digital signal line to transmit the digital signals; and a second dielectric layer between said digital signal reference planes, said second dielectric layer is thinner than the first dielectric layer to modify a characteristic impedance of the analog signals to be higher than a characteristic impedance of the digital signals.

15. The circuit substrate for modifying characteristic impedance by using different reference planes of claim 14, at least one analog signal reference plane is on the same plane with at least one digital signal reference plane.

16. The circuit substrate for modifying characteristic impedance by using different reference planes of claim 14, further comprising a third dielectric layer between said analog signal reference planes.

17. The circuit substrate for modifying characteristic impedance by using different reference planes of claim 16, further comprising a forth dielectric layer between said digital signal reference planes.

18. The circuit substrate for modifying characteristic impedance by using different reference planes of claim 14, further comprising a third dielectric layer between said digital signal reference planes.

19. The circuit substrate for modifying characteristic impedance by using different reference planes of claim 14, wherein the analog signal reference plane is a power plane or a ground plane.

20. The circuit substrate for modifying characteristic impedance by using different reference planes of claim 14, wherein the digital signal reference plane is a power plane or a ground plane.

\* \* \* \* \*